US012578406B2

(12) United States Patent　　(10) Patent No.: US 12,578,406 B2
Zhang et al.　　(45) Date of Patent: Mar. 17, 2026

(54) MAGNETIC RESONANCE IMAGING SYSTEM AND METHOD

(71) Applicant: GE Precision Healthcare LLC, Waukesha, WI (US)

(72) Inventors: Hanbei Zhang, Beijing (CN); Yongchuan Lai, Beijing (CN); Wei Chang, Beijing (CN)

(73) Assignee: GE Precision Healthcare LLC, Waukesha, WI (US)

( * ) Notice: Subject to any disclaimer, the term of this patent is extended or adjusted under 35 U.S.C. 154(b) by 162 days.

(21) Appl. No.: 18/535,869

(22) Filed: Dec. 11, 2023

(65) Prior Publication Data

US 2024/0219499 A1　　Jul. 4, 2024

(30) Foreign Application Priority Data

Dec. 29, 2022　(CN) .......................... 202211710870.9

(51) Int. Cl.
　*G01V 3/00*　　　(2006.01)
　*G01R 33/385*　　(2006.01)
　*G01R 33/56*　　　(2006.01)
　*G01R 33/567*　　(2006.01)

(52) U.S. Cl.
　CPC ....... *G01R 33/5608* (2013.01); *G01R 33/385* (2013.01); *G01R 33/5607* (2013.01); *G01R 33/5673* (2013.01)

(58) Field of Classification Search
　CPC .............................................. G01R 33/56509
　USPC ........................................................ 324/309
　See application file for complete search history.

(56) References Cited

U.S. PATENT DOCUMENTS

| | | | | |
|---|---|---|---|---|
| 3,924,129 A | * | 12/1975 | LeMay | ................. G06T 11/006 |
| | | | | 250/363.01 |
| 2020/0341087 A1 | * | 10/2020 | Zhang | ................ G01R 33/4828 |

FOREIGN PATENT DOCUMENTS

| | | | | | |
|---|---|---|---|---|---|
| CN | 106073782 A | * | 11/2016 | ........... | A61B 5/6831 |
| CN | 106952261 A | * | 7/2017 | .......... | G06T 7/0012 |
| CN | 111443318 A | * | 7/2020 | ............. | G01R 33/58 |
| JP | 2008289862 A | * | 12/2008 | ........... | G01R 33/543 |

OTHER PUBLICATIONS

CN 106952261 A (Sun) (Year: 2017).*
Desmond et al., "Comparison of biphasic and reordered fat suppression for dynamic breast MRI." Journal of Magnetic Resonance Imaging: An Official Journal of the International Society for Magnetic Resonance in Medicine 25.6 (2007): 1293-1298, 6 pages.
(Continued)

*Primary Examiner* — Walter L Lindsay, Jr.
*Assistant Examiner* — Frederick Wenderoth

(57) ABSTRACT

Provided in the present invention are a magnetic resonance imaging system and method. The magnetic resonance imaging method comprises: performing m NEXs, wherein in each NEX, a plurality of fat suppression pulses are applied, each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1; and reconstructing a magnetic resonance image on the basis of at least a portion of the initial image data acquired in the m NEXs.

17 Claims, 16 Drawing Sheets

(56)     References Cited

OTHER PUBLICATIONS

Flask et al. "Radial alternating TE sequence for faster fat suppression." Magnetic Resonance in Medicine: An Official Journal of the International Society for Magnetic Resonance in Medicine 50.5 (2003): 1095-1099, 5 pages.

Hedderich et al. "Clinical evaluation of free-breathing contrast-enhanced T1w MRI of the liver using pseudo golden angle radial k-space sampling." RöFo-Fortschritte auf dem Gebiet der Röntgenstrahlen und der bildgebenden Verfahren. Vol. 190. No. 07. @ Georg Thieme Verlag KG, 2018, 9 pages.

Hilfiker et al., "Partial fat-saturated contrast-enhanced three-dimensional MR angiography compared with non-fat-saturated and conventional fat-saturated MR angiography." Radiology 216.1 (2000): 298-303, 6 pages.

* cited by examiner

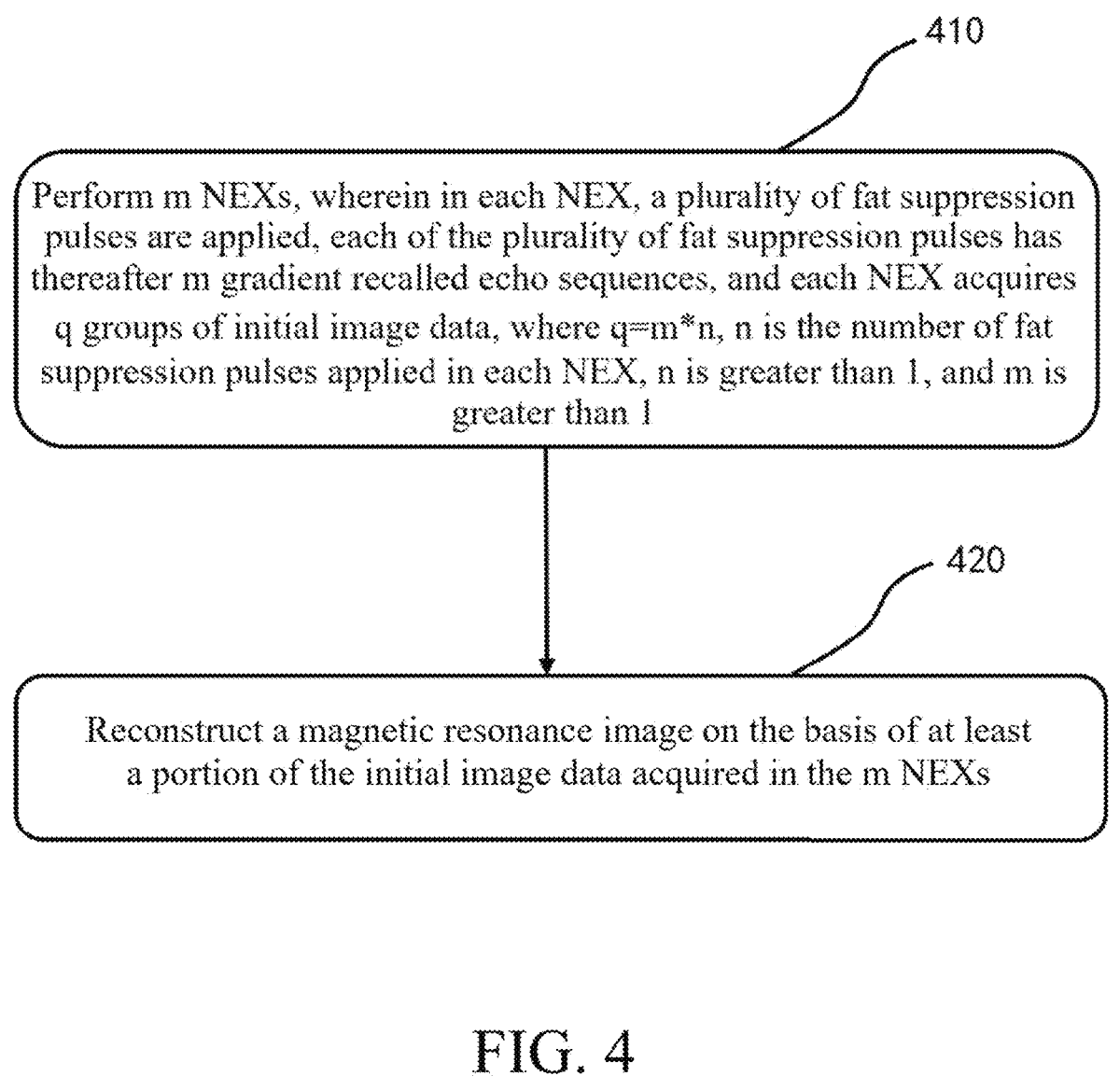

410

Perform m NEXs, wherein in each NEX, a plurality of fat suppression pulses are applied, each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1

420

Reconstruct a magnetic resonance image on the basis of at least a portion of the initial image data acquired in the m NEXs

FIG. 4

| Summed image data | | I1 | I2 | I3 | I4 | I5 | |
|---|---|---|---|---|---|---|---|
| NEX=1 | k1 | k2 | k3 | k4 | k5 | k6 | |
| | s1 | s2 | s1 | s2 | s1 | s2 | s2 |
| NEX=2 | | s1 | s2 | s1 | s2 | s1 | s2 |
| | | k1 | k2 | k3 | k4 | k5 | k6 |

FIG. 7

| Summed image data |    |    | i6 | i7 | i8 | i9 |    |    |
|---|---|---|---|---|---|---|---|---|
| NEX=1 | k1 | k2 | k3 | k4 | k5 | k6 |    |    |
| NEX=2 | s1 | s2 | s3 | s1 | s2 | s3 | s3 |    |
| NEX=3 |    | s1 | s2 | s3 | s1 | s2 | s2 | s3 |

FIG. 8

Perform m NEXs, wherein in each NEX, a plurality of fat suppression pulses are applied, each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1

Reconstruct a magnetic resonance image on the basis of a plurality of groups of summed image data, wherein, each group of summed image data comprises the sum of m groups of initial image data, the m groups of initial image data of each group of summed image data have different phases, and the m groups of initial image data of each group of summed image data are generated in the m NEXs, respectively

FIG. 9

410

Perform m NEXs, wherein in each NEX, a plurality of fat suppression pulses are applied, each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1

1020

Reconstruct a magnetic resonance image on the basis of q-m+1 groups of summed image data, wherein each group of data of the q-m+1 groups of summed image data comprises a summation result of m groups of initial image data respectively acquired in the m NEXs, and wherein an sth group of initial image data in each subsequently performed NEX is summed with an (s+1)th group of initial image data in a previously performed NEX, where s is greater than or equal to 1 and less than q

FIG. 10

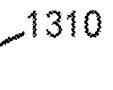

1310

Perform at least one NEX, wherein, in each of the at least one NEX, a plurality of fat suppression pulses are applied, each of the plurality of fat suppression pulses has thereafter m gradient recalled echo sequences, each gradient recalled echo sequence is used to generate a group of initial image data, where m is greater than 1, the fat suppression pulses comprise a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency

1320

Reconstruct a magnetic resonance image on the basis of at least a portion of the initial image data generated during the at least one NEX

FIG. 13

MAGNETIC RESONANCE IMAGING SYSTEM AND METHOD

CROSS REFERENCE TO RELATED APPLICATIONS

The present application claims priority and benefit of Chinese Patent Application No. 202211710870.9 filed on Dec. 29, 2022, which is incorporated herein by reference in its entirety.

TECHNICAL FIELD

The present invention relates to the field of medical imaging, and in particular to a magnetic resonance imaging (MRI) system and method.

BACKGROUND

Gradient recalled echo (GRE) sequences are one type of fast imaging technique currently used for magnetic resonance due to the short time of repeat (TR) thereof. Therefore, in some applications in which the scan time is required to be shortened, GRE sequences are selected. However, the direct use of GRE sequences is prone to artifacts. For example, in abdominal scans, the direct use of GRE sequences may cause more pronounced motion artifacts or inappropriate contrast between tissues, such as a liver site being too dark and adipose tissue around the liver being too bright, which is disadvantageous for medical observations.

SUMMARY

An aspect of the present invention provides a magnetic resonance imaging method, comprising: performing m NEXs, wherein in each NEX, a plurality of fat suppression pulses are applied, each of the plurality of fat suppression pulses has thereafter m gradient recalled echo sequences, and each NEX acquires q groups of initial image data, where q=m*n, and n is the number of fat suppression pulses applied in each NEX; and reconstructing a magnetic resonance image on the basis of at least a portion of the initial image data acquired in the m NEXs.

Another aspect of the present invention further provides a magnetic resonance imaging method, comprising: applying a plurality of fat suppression pulses in each NEX, wherein each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1; and reconstructing a magnetic resonance image on the basis of a plurality of groups of summed image data, wherein each group of summed image data comprises the sum of m groups of initial image data, the m groups of initial image data of each group of summed image data have different phases, and the m groups of initial image data of each group of summed image data are generated in the m NEXs, respectively.

Another aspect of the present invention further provides a magnetic resonance imaging method, comprising:

performing at least one NEX, wherein in each of the at least one NEX, a plurality of fat suppression pulses are applied, each of the plurality of fat suppression pulses has thereafter m gradient recalled echo sequences, each gradient recalled echo sequence is used to generate a group of initial image data, where m is greater than 1, the fat suppression pulses comprise a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency; and reconstructing a magnetic resonance image on the basis of at least a portion of the initial image data generated during the at least one NEX.

Another aspect of the present invention further provides a magnetic resonance imaging system, comprising: a main magnet used to surround at least a portion of a scan subject and produce a static magnetic field; a gradient coil assembly used to apply at least one gradient magnetic field to the static magnetic field; a radio frequency coil assembly used to apply a radio frequency field to the scan subject and receive a magnetic resonance signal from the scan subject; and a processor used to execute stored computer instructions, the computer instructions being used to implement the magnetic resonance imaging method described in any one of the above aspects.

It should be understood that the brief description above is provided to introduce, in a simplified form, concepts that will be further described in the detailed description. The brief description above is not meant to identify key or essential features of the claimed subject matter. The scope is defined uniquely by the claims that follow the detailed description. Furthermore, the claimed subject matter is not limited to implementations that solve any deficiencies raised above or in any section of the present disclosure.

BRIEF DESCRIPTION OF THE DRAWINGS

The present invention will be better understood by reading the following description of non-limiting embodiments with reference to the accompanying drawings, wherein

FIG. 3 is a schematic diagram of an exemplary imaging sequence used by the method shown in FIG. 2;

FIG. 4 shows a flowchart of a magnetic resonance imaging method according to an embodiment of the present invention;

FIGS. 7 and 8 show schematic diagrams of image data acquired according to embodiments of the present invention;

FIG. 9 shows a flowchart of a magnetic resonance imaging method according to another embodiment of the present invention;

FIG. 10 shows a flowchart of a magnetic resonance imaging method according to another embodiment of the present invention;

FIG. 13 shows a flowchart of a magnetic resonance imaging method according to another embodiment of the present invention;

The accompanying drawings illustrate components, systems, and methods described in the MRI method and system. Together with the following description, the accompanying drawings illustrate and explain structural principles, methods and principles described herein. In the accompanying drawings, the thickness and dimensions of the components may be enlarged or otherwise modified for clarity. Well-known structures, materials, or operations are not shown or described in detail to avoid obscuring the components, systems, and methods described.

DETAILED DESCRIPTION

Specific embodiments of the present invention will be described below. It should be noted that in the specific description of said embodiments, for the sake of brevity and conciseness, the present description cannot describe all of the features of the actual embodiments in detail. It should be understood that in the actual implementation process of any embodiment, just as in the process of any one engineering project or design project, a variety of specific decisions are often made to achieve specific goals of the developer and to meet system-related or business-related constraints, which may also vary from one embodiment to another. Furthermore, it should also be understood that although efforts made in such development processes may be complex and tedious, for a person of ordinary skill in the art related to the content disclosed in the present invention, some design, manufacture, or production changes made on the basis of the technical content disclosed in the present disclosure are only common technical means, and should not be construed as the content of the present disclosure being insufficient.

Unless otherwise defined, the technical or scientific terms used in the claims and the description should be as they are usually understood by those possessing ordinary skill in the technical field to which they belong. Terms such as "first", "second", and similar terms used in the present description and claims do not denote any order, quantity, or importance, but are only intended to distinguish different constituents. The terms "one" or "a/an" and similar terms do not express a limitation of quantity, but rather that at least one is present. The terms "include" or "comprise" and similar words indicate that an element or object preceding the terms "include" or "comprise" encompasses elements or objects and equivalent elements thereof listed after the terms "include" or "comprise", and do not exclude other elements or objects. The terms "connect" or "link" and similar words are not limited to physical or mechanical connections, and are not limited to direct or indirect connections. Furthermore, it should be understood that references to "an embodiment" or "embodiments" of the present disclosure are not intended to be construed as excluding the existence of additional implementations that also incorporate the referenced features.

Figure 1:
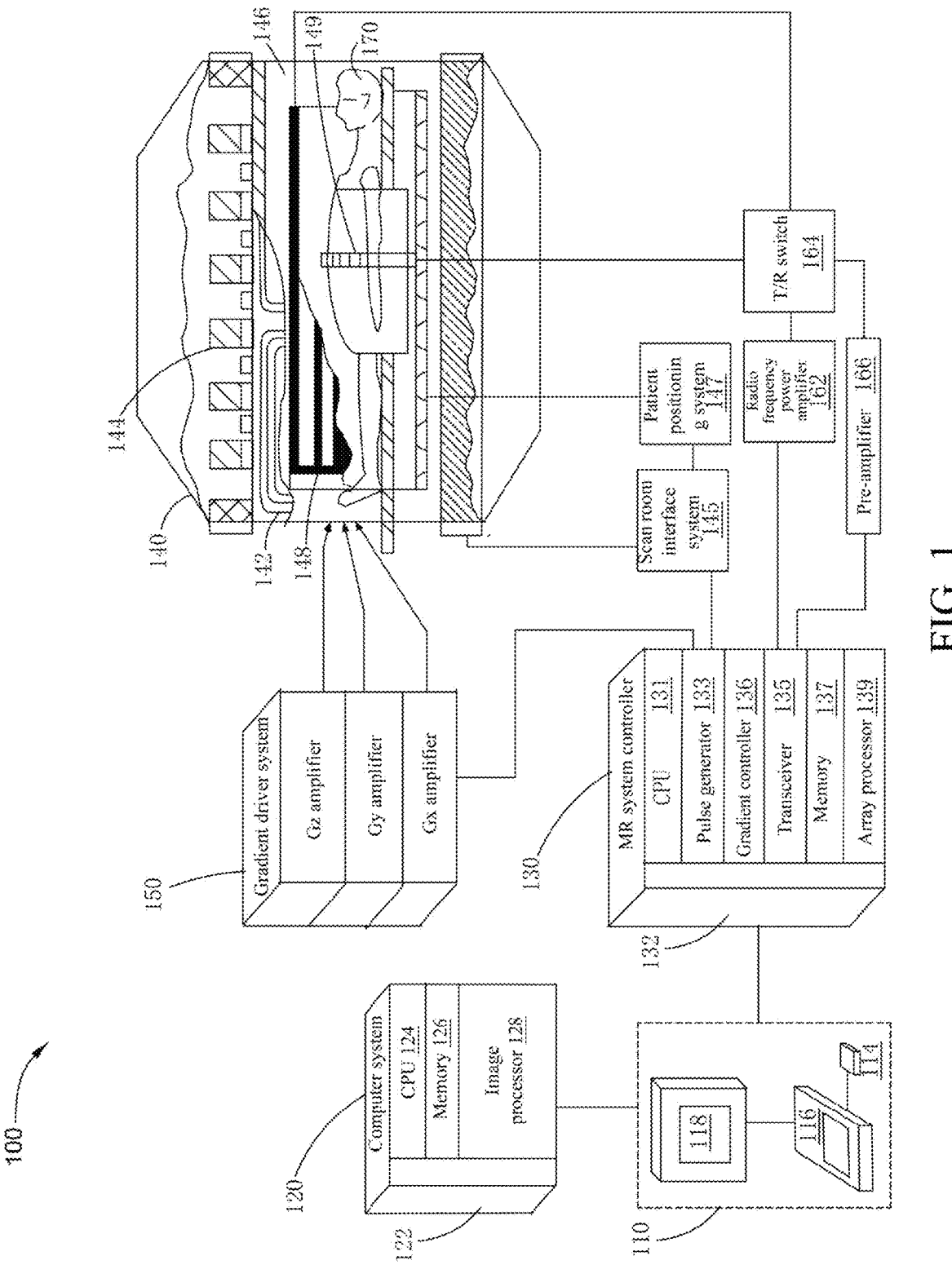
FIG. 1 is a schematic diagram of a magnetic resonance imaging system according to an exemplary embodiment.

Referring to FIG. 1, a schematic diagram of an exemplary magnetic resonance imaging (MRI) system 100 according to some embodiments is shown. The operation of the MRI system 100 is controlled by an operator workstation 110 that includes an input device 114, a control panel 116, and a display 118. The input device 114 may be a joystick, a keyboard, a mouse, a trackball, a touch-activated screen, voice control, or any similar or equivalent input device. The control panel 116 may include a keyboard, a touch-activated screen, voice control, a button, a slider, or any similar or equivalent control device. The operator workstation 110 is coupled to and in communication with a computer system 120 that enables an operator to control generation and display of images on the display 118. The computer system 120 includes various components that communicate with one another via an electrical and/or data connection module 122. The connection module 122 may be a direct wired connection, a fiber optic connection, a wireless communication link, etc. The computer system 120 may include a central processing unit (CPU) 124, a memory 126, and an image processor 128. In some embodiments, the image processor 128 may be replaced by image processing functions implemented in the CPU 124. The computer system 120 may be connected to an archive media device, a persistent or backup memory, or a network. The computer system 120 may be coupled to and communicates with a separate MR system controller 130.

The MR system controller 130 includes a set of components that communicate with one another via an electrical and/or data connection module 132. The connection module 132 may be a direct wired connection, a fiber optic connection, a wireless communication link, etc. The MR system controller 130 may include a CPU 131, a sequence pulse generator 133 which is in communication with the operator workstation 110, a transceiver (or an RF transceiver) 135, a memory 137, and an array processor 139. In some embodiments, the sequence pulse generator 133 may be integrated into a resonance assembly 140 of the MRI system 100.

A subject 170 of an MR scan may be positioned within a cylindrical imaging volume 146 of the magnetic resonance assembly 140 by means of a scanning table. The MR system controller 130 controls the scanning table to travel in a Z-axis direction of the magnetic resonance system so as to transport the subject 170 into the imaging volume 146. The magnetic resonance assembly 140 includes a superconducting magnet (or a main magnet) having a superconducting coil 144, a radio frequency coil assembly, and a gradient coil assembly 142. The superconducting coil 144 has a magnet aperture to form the cylindrical imaging volume. During operation, the superconducting coil 144 provides a static uniform longitudinal magnetic field $B_0$ throughout the cylindrical imaging volume 146. The radio frequency coil assembly may include a body coil 148 and a surface coil 149, and may be used to send and/or receive a radio frequency signal.

The MR system controller 130 may receive a command from the operator workstation 110 to indicate an MRI scan sequence that is to be executed during the MRI scan. The sequence pulse generator 133 of the MR system controller 130 sends, on the basis of the indicated sequence, an instruction describing the time sequences, intensities, and shapes of the radio frequency pulse and gradient pulse in the sequence so as to operate a system component that executes the sequence.

The radio frequency pulse in the scan sequence sent by the sequence pulse generator 133 may be generated by the transceiver 135, and the radio frequency pulse is amplified by a radio frequency power amplifier 162. The amplified radio frequency pulse is provided to the body coil 148 by means of a transmit/receive switch (T/R switch) 164, and the RF body coil 148 in turn provides a transverse magnetic field $B_1$. The transverse magnetic field $B_1$ is substantially perpendicular to $B_0$ throughout the entire cylindrical imaging volume 146. The transverse magnetic field $B_1$ is used to excite stimulated nuclei (or protons) in the body of the scan subject so as to generate an MR signal.

The gradient pulse in the scan sequence sent by the sequence pulse generator 133 may be generated by means of the gradient controller 136 and acts on a gradient driver 150. The gradient driver 150 includes $G_x$, $G_y$, and $G_z$ amplifiers, and the like. Each of the $G_x$, $G_y$, and $G_z$ gradient amplifiers is used to excite a corresponding gradient coil in the gradient coil assembly 142 so as to generate a gradient magnetic field superimposed on a static magnetic field, and is used to spatially encode an MR signal during an MR scan.

The sequence pulse generator 133 may further receive data from a physiological acquisition controller (not shown in the figure), which receives signals from a plurality of different sensors (such as electrocardiogram (ECG) signals from electrodes attached to a patient, respiratory signals used to monitor the patient's respiratory motion, etc.), which are connected to the subject or patient 170 undergoing an MRI scan. The sequence pulse generator 133 is coupled to and in communication with a scan room interface system 145 that receives signals from various sensors associated with the state of the resonance assembly 140. The scan room interface system 145 is further coupled to and in communication with a patient positioning system 147 that sends and receives signals to control movement of a patient table to a desired position to perform the MRI scan.

The RF resonance assembly may further include the body coil 148, which, in operation, provides a lateral magnetic field $B_1$, and the lateral magnetic field $B_1$ is substantially perpendicular to $B_0$ throughout the cylindrical imaging volume 146. Specifically, the transceiver 135 in the MR system controller 130 generates an RF excitation pulse that is amplified by the RF amplifier 162 and provided to the body coil 148 by means of the transmit/receive switch (T/R switch) 164. The RF resonance assembly may further include the surface coil 149 for imaging different anatomical structures of the patient undergoing the MRI scan. The body coil 148 and the surface coil 149 may be configured to operate in a transmitting and receiving mode, a transmitting mode, or a receiving mode.

As described above, the RF body coil 148 and the RF surface coil 149 may be used to transmit RF excitation pulses and/or receive resulting MR signals from the patient undergoing the MRI scan. The MR signals emitted by excited nuclei in the body of the patient of the MRI scan may be sensed and received by the body coil 148 or the surface coil 149 and sent back to a preamplifier 166 by means of the T/R switch 164. The T/R switch 164 may be controlled by a signal from the sequence pulse generator 133 to electrically connect the RF amplifier 162 to the body coil 148 in the transmitting mode and to connect the preamplifier 166 to the body coil 148 in the receiving mode. The T/R switch 164 may further enable the surface coil 149 to be used in the transmitting mode or the receiving mode.

In some embodiments, the MR signals sensed and received by the RF body coil 148 or the RF surface coil 149 and amplified by the preamplifier 166 are demodulated, filtered, and digitized in a receiving portion of the transceiver 135, and stored in the memory 137 as a raw image data array for post-processing. A reconstructed magnetic resonance image may be obtained by transforming/processing the stored raw image data.

In some embodiments, the MR signals sensed and received by the RF body coil 148 or the RF surface coil 149 and amplified by the preamplifier 166 are demodulated, filtered, and digitized in a receiving portion of the transceiver 135, and transmitted to the memory 137 in the MR system controller 130. For each image to be reconstructed, the data is rearranged into a separate image data array, and each of these separate image data arrays is inputted to the array processor 139. The array processor is operated to transform the data into an array of image data by Fourier transform.

The array processor 139 uses transform methods, most commonly Fourier transform, to create images from the received MR signals. These images are transmitted to the computer system 120 and stored in the memory 126. In response to commands received from the operator workstation 110, the image data may be stored in a long-term memory, or may be further processed by the image processor 128 and transmitted to the operator workstation 110 for presentation on the display 118.

In various embodiments, components of the computer system 120 and the MR system controller 130 may be implemented on the same computer system or on a plurality of computer systems. It should be understood that the MRI system 100 shown in FIG. 1 is intended for illustration. Suitable MRI systems may include more, fewer, and/or different components.

The MR system controller 130 and the image processor 128 may separately or collectively include a computer processor and a storage medium. The storage medium records a predetermined data processing program to be executed by the computer processor. For example, the storage medium may store a program used to implement scanning processing (such as a scan flow and an imaging sequence), image reconstruction, image processing, etc. For example, the storage medium may store a program used to implement the magnetic resonance imaging method according to the embodiments of the present invention. The described storage medium may include, for example, a ROM, a floppy disk, a hard disk, an optical disk, a magneto-optical disk, a CD-ROM, or a non-volatile memory card.

The aforementioned "imaging sequence" refers to a combination of pulses having specific amplitudes, widths, directions, and time sequences and applied when a magnetic resonance imaging scan is executed. The pulses may typically include, for example, a radio-frequency pulse and a gradient pulse. The radio frequency pulse may include, for example, a radio frequency excitation pulse, a radio frequency refocusing pulse, an inverse recovery pulse or the like, and a fat suppression pulse. The gradient pulse may include, for example, a gradient pulse used for layer selection, a gradient pulse used for phase encoding, a gradient pulse used for frequency encoding, a gradient pulse used for phase shift (phase shifting), a fat suppression pulse used for adipose tissue suppression, a spoiled gradient pulse used for destroying or eliminating a steady-state transverse magnetization vector (or phase dispersion of an accelerated spin echo signal), an out-of-phase pulse for discrete phases (or dephasing), phase focusing pulse for refocusing discrete phases, etc.

Typically, a plurality of scanning sequences may be preset in the magnetic resonance system (e.g., the computer system 120 of the magnetic resonance system), so that a sequence suitable for clinical examination requirements can be selected. The clinical examination requirements may include, for example, an imaging site, an imaging function, an imaging effect, etc. In some embodiments, the plurality of pre-stored scanning sequences may include one or more sequences applied to the present invention.

Figure 2:
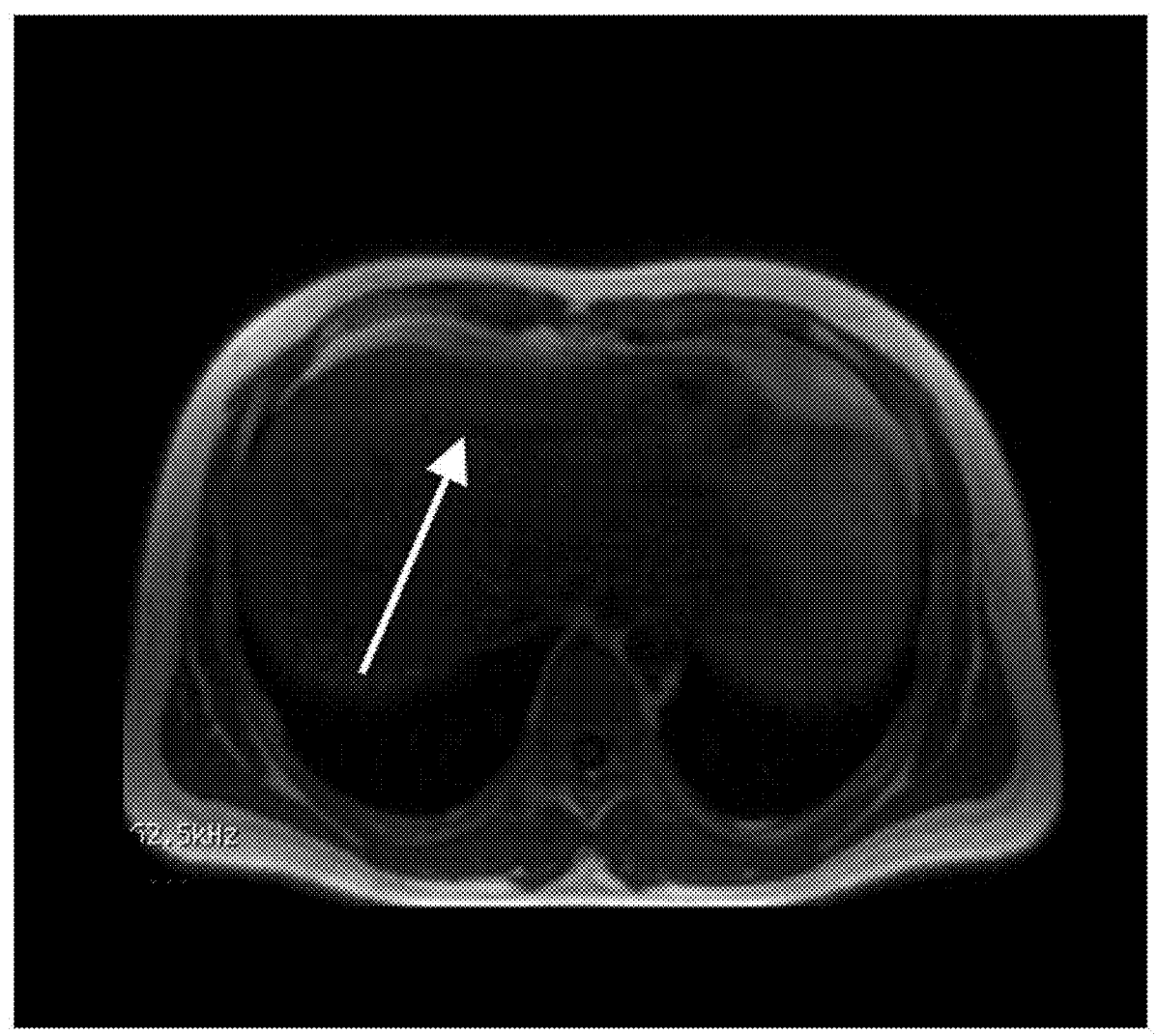
FIGS. 2 and 3 are magnetic resonance images obtained according to an existing fast scanning technique.
Figure 3:
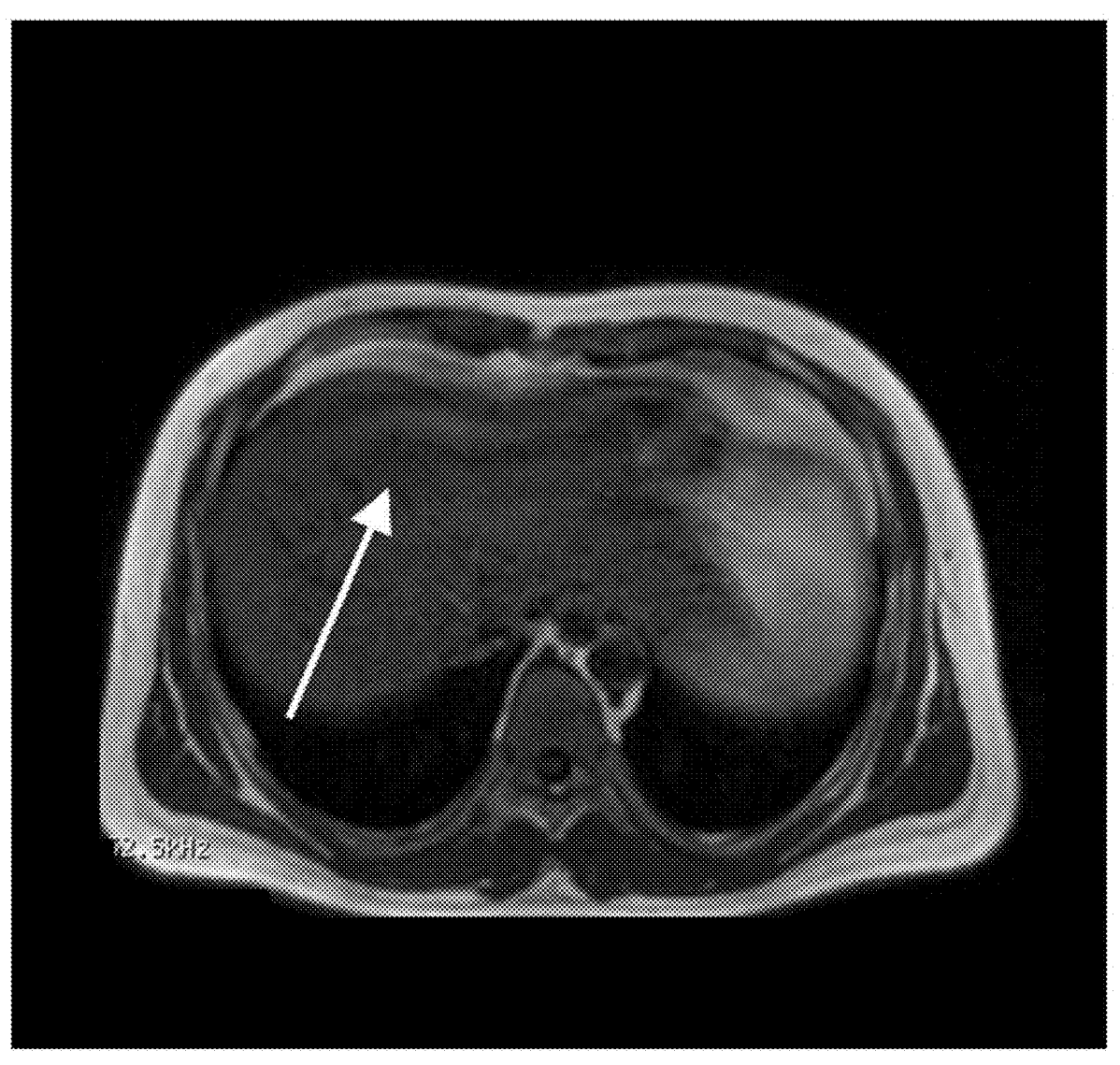

When performing magnetic resonance imaging of the subject, respiratory motion may cause respiratory motion artifacts in the image, which may be particularly pronounced when abdominal imaging is performed. In the prior art, a variety of methods of reducing respiratory motion artifacts are proposed, and one method among them is to reduce scan time by using fast imaging techniques, thereby reducing the effect of respiratory motion. Such imaging techniques typically cannot be combined with a fat suppression sequence because the fat suppression sequence increases scan time. However, if no fat suppression sequence is applied, some image quality issues will arise. For example, as shown in FIG. 2, there is inappropriate contrast between darker liver tissue and brighter adipose tissue, and, as shown in FIG. 3, bright fat results in a more pronounced respiratory motion artifact.

Another method that may be used to reduce respiratory motion artifacts includes a navigation technique, i.e., tracking respiratory motion by means of a navigation sequence to enable imaging within a particular period of a respiratory cycle. The navigation sequence outside of the imaging sequence consumes more time, and does not provide better image quality for some subjects with asthma or other respiratory illness.

A respiratory gating method may also be used, in which an imaging scan sequence is controlled to be performed within a particular time window of the respiratory cycle on the basis of a respiratory signal of the subject. This method may reduce respiratory motion artifacts, but is more time-consuming.

It is also possible to use a spiral k-space acquisition trajectory to repeatedly acquire data, and perform image correction on the basis of respiratory motion information in the repeatedly acquired data, which increases the complexity of k-space acquisition, and is prone to aliasing artifacts.

Figure 5:
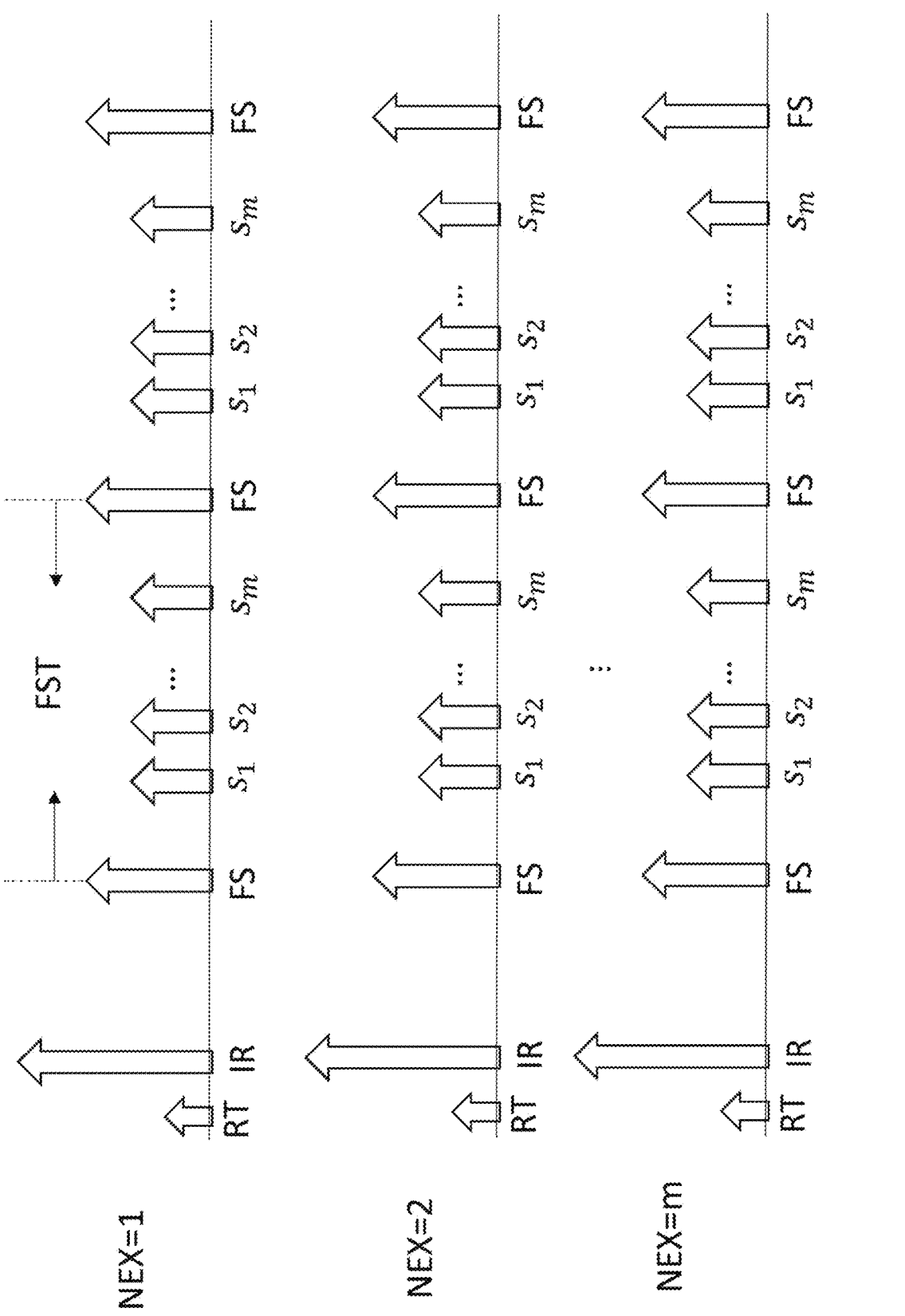
FIG. 5 shows an example diagram of an imaging sequence used in a magnetic resonance imaging method according to an embodiment of the present invention.

Referring to FIGS. 4 and 5, FIG. 4 shows a flowchart of a magnetic resonance imaging method according to an embodiment of the present invention, and FIG. 5 shows an example diagram of an imaging sequence used in a magnetic resonance imaging method according to an embodiment of the present invention, wherein some pulses are optional rather than required.

In step 410, m NEXs are performed, where m is greater than 1. It is understood by those skilled in the art that NEX is the number of signal excitations (number of excitations). Generally, the greater the number of NEXs, the better the signal-to-noise ratio (SNR) that can be obtained.

In step 410, in each NEX, a plurality of fat suppression pulses FS are applied, each fat suppression pulse FS having thereafter m gradient recalled echo sequences (e.g., $S_1$-$S_m$ in FIG. 5). It is understood by those skilled in the art that the gradient recalled echo sequence uses switching of a gradient field to generate echoes. The gradient recalled echo sequence includes many different types of sequences. For example, the gradient recalled echo sequence may include a conventional gradient recalled echo sequence, in which an out-of-phase pulse and a phase focusing pulse in opposite directions are set on a frequency encoding gradient, and echoes are generated during the application of the phase focusing pulse. The gradient recalled echo sequence may also include a steady-state free precession sequence, a balanced steady-state free precession sequence, a non-balanced steady-state free precession sequence, a spoiled gradient recalled echo sequence, more other types of gradient recalled echo sequences, etc. Any type of gradient recalled echo sequence may be used in the present embodiment on the basis of a scan site or other imaging requirements. A detailed description will be given below using the spoiled gradient recalled echo sequence as an example.

It is understood by those skilled in the art that the spoiled gradient recalled echo sequence may include a plurality of small-angle radio frequency excitation pulses. The small-angle radio frequency excitation pulses have a flip angle that is less than 90 degrees. Each of the small-angle radio frequency excitation pulses has a spoiled gradient pulse on a gradient axis before a subsequently applied radio frequency excitation pulse, which is used for a residual signal after previous data acquisition to avoid affecting a next excited signal. There are a variety of spoiled gradient recalled echo sequences having different names in the prior art, such as spoiled gradient recalled echo (SPGR) used by some magnetic resonance manufacturers, fast field echo (T1-FFE) and fast low angle shot (LASH) used by some other manufacturers, etc.

Figure 6:
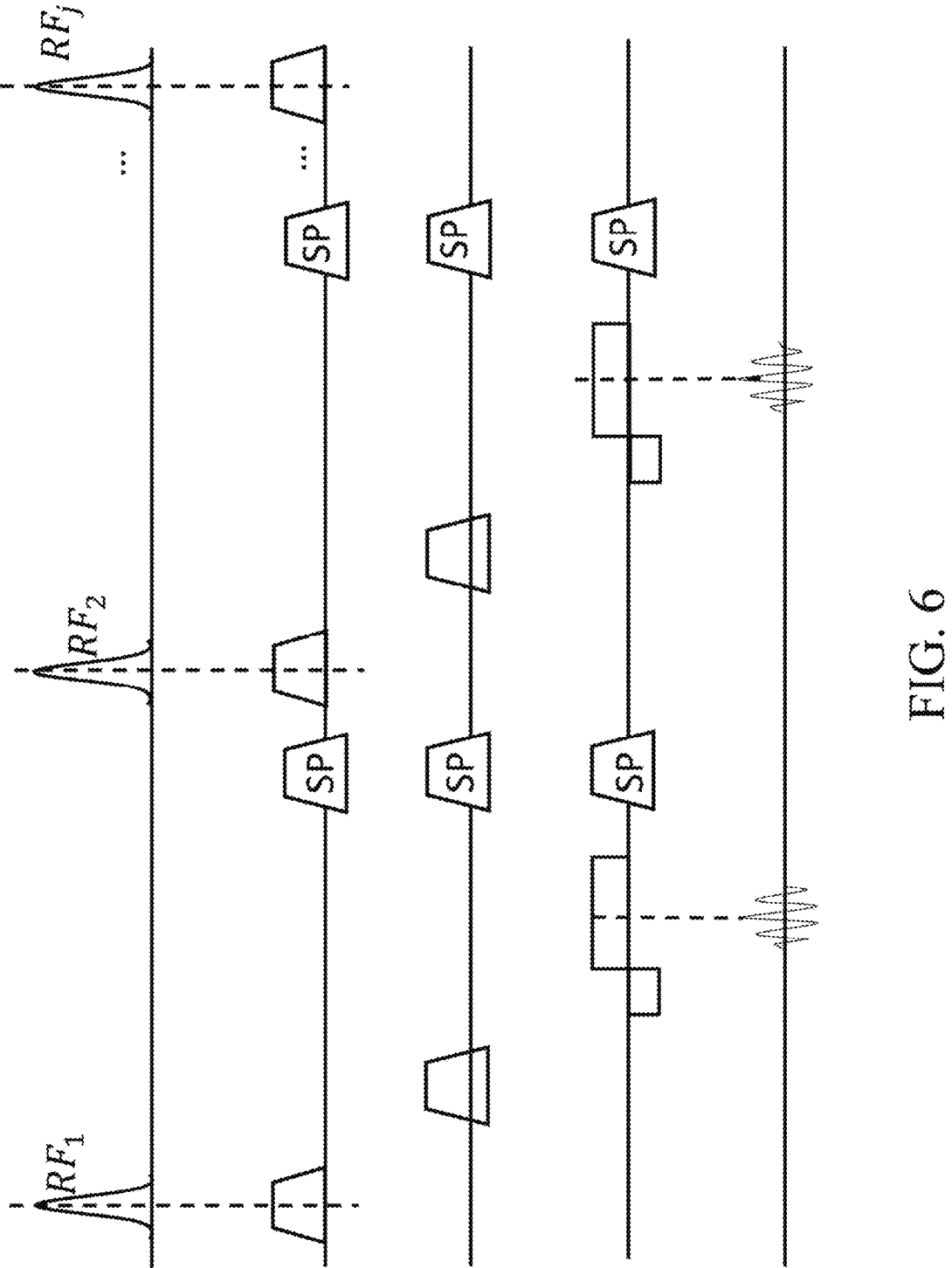
FIG. 6 shows an example of a spoiled gradient recalled echo sequence.

FIG. 6 illustratively shows a spoiled gradient recalled echo sequence, which includes a plurality of small-angle radio frequency excitation pulses $RF_1$, $RF_2$, . . . $RF_j$, where j is greater than 2. In some examples, there may be only two radio frequency excitation pulses, and each subsequently applied small angle radio frequency excitation pulse $RF_2$ . . . $RF_j$ is preceded by a spoiled gradient pulse SP applied on a gradient axis. The sequence shown in FIG. 6 is merely illustrative, and an actual sequence may further include more details.

In step 420, a magnetic resonance image is reconstructed on the basis of at least a portion of initial image data acquired in the m NEXs.

In the embodiments of the present invention, while the fat suppression pulses are used, the gradient recalled echo sequence for fast imaging is applied after each fat suppression pulse, so that there is no need to provide a corresponding fat suppression pulse for each fast imaging sequence, and the overall scan time is shorter. Moreover, since the plurality of gradient recalled echo sequences are used as a fast imaging sequence, the sequence has a shorter time of repeat (TR) (a smaller time interval between adjacent radio frequency excitation pulses). Therefore, the overall scan time is also shorter. When the spoiled gradient recalled echo sequence is used, the scan time may be shorter due to the application of the spoiled gradient pulse SP so that the shorter TR is provided. By using fat suppression pulses, the fat signal is effectively suppressed during imaging, avoiding inappropriate contrast between fat and other tissues, while avoiding the introduction of more pronounced respiratory motion artifacts into the image. By using a plurality of NEXs instead of a single NEX and reconstructing a magnetic resonance image on the basis of at least a portion of the initial image data acquired in the plurality of NEXs, the signal-to-noise ratio of the image is improved and aliasing artifacts are reduced.

Each group of initial image data described above may refer to an echo signal obtained during each gradient recalled echo sequence, which can be filled in a k space as a group of initial image data.

On the basis of the embodiments described above, each NEX may acquire q groups of initial image data, and m NEXs may acquire m*q groups of initial image data, where q=m*n, n is the number of fat suppression pulses FS applied in each NEX, and n is greater than 1.

In the embodiments of the present invention, the m NEXs have the same sequence structure, and therefore, the pulse profiles in any two NEXs are corresponding, and the initial image data generated during respective gradient recalled echo sequences in the m NEXs has the same phase (for example, a first gradient recalled echo sequence in a first NEX corresponds to a first gradient recalled echo sequence in a second NEX). In addition, the gradient recalled echo sequences after different fat suppression pulses FS are also corresponding (for example, a first gradient recalled echo sequence after a first fat suppression pulse corresponds to a first gradient recalled echo sequence after a second fat suppression pulse), and the initial image data generated during respective gradient recalled echo sequences after different fat suppression pulses FS also has the same phase. In contrast, the phase of the initial image data generated during a plurality of respective gradient recalled echo sequences after the same fat suppression pulse changes sequentially (for example, in the same NEX, the initial image data generated by a second gradient recalled echo sequence after a first fat suppression pulse and the initial image data generated by a first gradient recalled echo sequence after the first fat suppression pulse have different phases).

FIGS. 7 and 8 shows schematic diagrams of image data acquired during the execution of the m NEXs. In FIG. 7, m is 2, and each NEX includes 3 repetition times, that is, n=3. Therefore, 6 groups of initial image data k1 to k6 are acquired during each NEX, and are generated within 3 fat suppression pulse time intervals FST. Each interval FST has two gradient recalled echo sequences. A first signal s1 and a second signal s2 are generated during the execution of the gradient recalled echo sequence within each interval FST, respectively, wherein the first signal s1 has a first phase and the second signal s2 has a second phase.

In FIG. 8, m is 3 and n is 2. Therefore, 6 pieces of initial image data k1 to k6 are acquired during each NEX, and are generated within 2 intervals FST. Each interval FST has three gradient recalled echo sequences. A first signal s1, a second signal s2, and a third signal s3 are generated during the execution of three gradient recalled echo sequences within each interval FST, respectively, wherein the first signal s1 has a first phase, the second signal s2 has a second phase, and the third signal s3 has a third phase.

In step 420, image reconstruction may be performed on the basis of only a portion of the initial image data of the m*q groups of initial image data. For example, in the example of FIG. 7, one first signal s1 having the first phase in a first NEX is summed with one second signal s2 having the second phase in a second NEX to form a group of summed image data. One second signal s2 having the second phase in the first NEX is summed with one first signal s1 having the first phase in the second NEX to form another group of summed image data. By means of this combination of the first signal and the second signal, q−m+1 groups of summed image data can be obtained. That is, in the example shown in FIG. 7, 5 groups of summed image data I1 to I5 can be obtained, and a magnetic resonance image is reconstructed on the basis of the 5 groups of summed image data I1 to I5. The image obtained on the basis of this method has aliasing artifacts removed or reduced and has a better SNR.

As another example, in the example of FIG. 8, one first signal s1 having the first phase in a first NEX, one second signal s2 having the second phase in a second NEX, and one third signal s3 having the third phase in a third NEX are summed to form a group of summed image data. One second signal s2 having the second phase in the first NEX, one first signal s1 having the first phase in the second NEX, and one third signal s3 having the third phase in the third NEX are summed to form another group of summed image data. One third signal s3 having the third phase in the first NEX, one first signal s1 having the first phase in the second NEX, and one second signal s2 having the second phase in the third NEX are summed to form another group of summed image data. By means of this combination of the first signal, the second signal, and the third signal, q−m+1 groups of summed image data can be obtained. That is, in the example shown in FIG. 8, 4 groups of summed image data I6 to I9 can be obtained, and a magnetic resonance image is reconstructed on the basis of the 4 groups of summed image data I6 to I9.

However, a magnetic resonance image may also be reconstructed on the basis of all of the q*m groups of initial image data. For example, the initial image data acquired during respective gradient sequences in different NEXs is simply summed to acquire corresponding q groups of summed image data, and a magnetic resonance image is reconstructed on the basis of the q groups of summed image data. The magnetic resonance image obtained by this means may have some quality issues. However, such quality issues may be acceptable or improved by means of other image processing techniques.

FIG. 9 shows a flowchart of a magnetic resonance imaging method provided in another embodiment of the present invention, wherein in step 920, a magnetic resonance image is reconstructed on the basis of a plurality of groups of summed image data, wherein each group of summed image data (e.g., one of I1 to I9) includes the sum of m groups of initial image data, the m groups of initial image data of each group of summed image data have different phases, and the m groups of initial image data of each group of summed image data are generated in the m NEXs, respectively. Each group of initial image data of each group of summed image data is one of the q groups of initial image data in one NEX. For details, reference may be made to the examples described above with reference to FIGS. 7 and 8.

FIG. 10 shows a flowchart of a magnetic resonance imaging method provided in another embodiment of the present invention, wherein in step 1020, a magnetic resonance image is reconstructed on the basis of q−m+1 groups of summed image data, wherein each group of data in the q−m+1 groups of summed image data includes a summation result of m groups of initial image data respectively acquired in the m NEXs, and wherein an sth group of initial image data in each subsequently performed NEX is summed with an (s+1)th group of initial image data in a previously performed NEX, where s is greater than or equal to 1 and less than q. Continuing to take FIGS. 7 and 8 as examples, a data offset summation method is used when performing a summation combination. Specifically, in FIG. 7, the initial image data in the subsequently performed second NEX is offset backward by one data frame with respect to the initial image data in the first NEX, so that first initial image data (the first signal s1 in the first interval FST) in the subsequently performed second NEX is summed with second initial image data (the second signal s2 in the first interval FST) in the previous NEX (the first NEX), and second initial image data (the second signal s2 in the first interval FST) in the second NEX is summed with third initial image data (the first signal s1 in the second interval FST) in the first NEX . . . until the last initial image data (the second signal s2 in the third interval FST) in the first NEX is summed. In FIG. 8, the initial image data in the subsequently performed second NEX is offset backward by one data frame with respect to the initial image data in the first NEX, and the initial image data in the subsequently performed third NEX is offset backward by one data frame with respect to the initial image data in the second NEX, so that first initial image data (the first signal s1 in the first interval FST) in the third NEX is summed with second initial image data (the second signal s2 in the first interval FST) in the previous NEX (the second NEX), and then summed with third initial image data (the third signal s3 in the first interval FST) in the previous NEX (the first NEX); and second initial image data (the second signal s2 in the first interval FST) in the third NEX is summed with third initial image data (the third signal s3 in the first interval FST) in the previous NEX (the second NEX), and then summed with fourth initial image data (the first signal s1 in the second interval FST) in the previous NEX (the first NEX) . . . until the last initial image data (the third signal s3 in the second interval FST) in the first NEX is summed.

By attempting to use different numbers of NEXs, the inventors found that when one fat suppression pulse in an NEX has thereafter a plurality of gradient recalled echo sequences, if only one NEX is used for imaging, there is no aliasing artifact. If a plurality of NEXs are used, there may be aliasing artifacts, which are symmetrical on both sides of the image, and the increase in the number of aliasing artifacts is also consistent with the increase in the number of NEXs. In the embodiments of the present invention, the SNR is increased by using multiple groups of NEXs, and the summed image data is obtained by summing the initial image data of different phases (for example, using the above data offset summation method), which is equivalent to the imaging effect of using only one NEX (each piece of summed image data is equivalent to the image data acquired by all gradient recalled echo sequences after one fat suppression pulse in a single NEX), so that the aliasing artifacts can be effectively eliminated, and a better SNR can be maintained.

Figure 11:
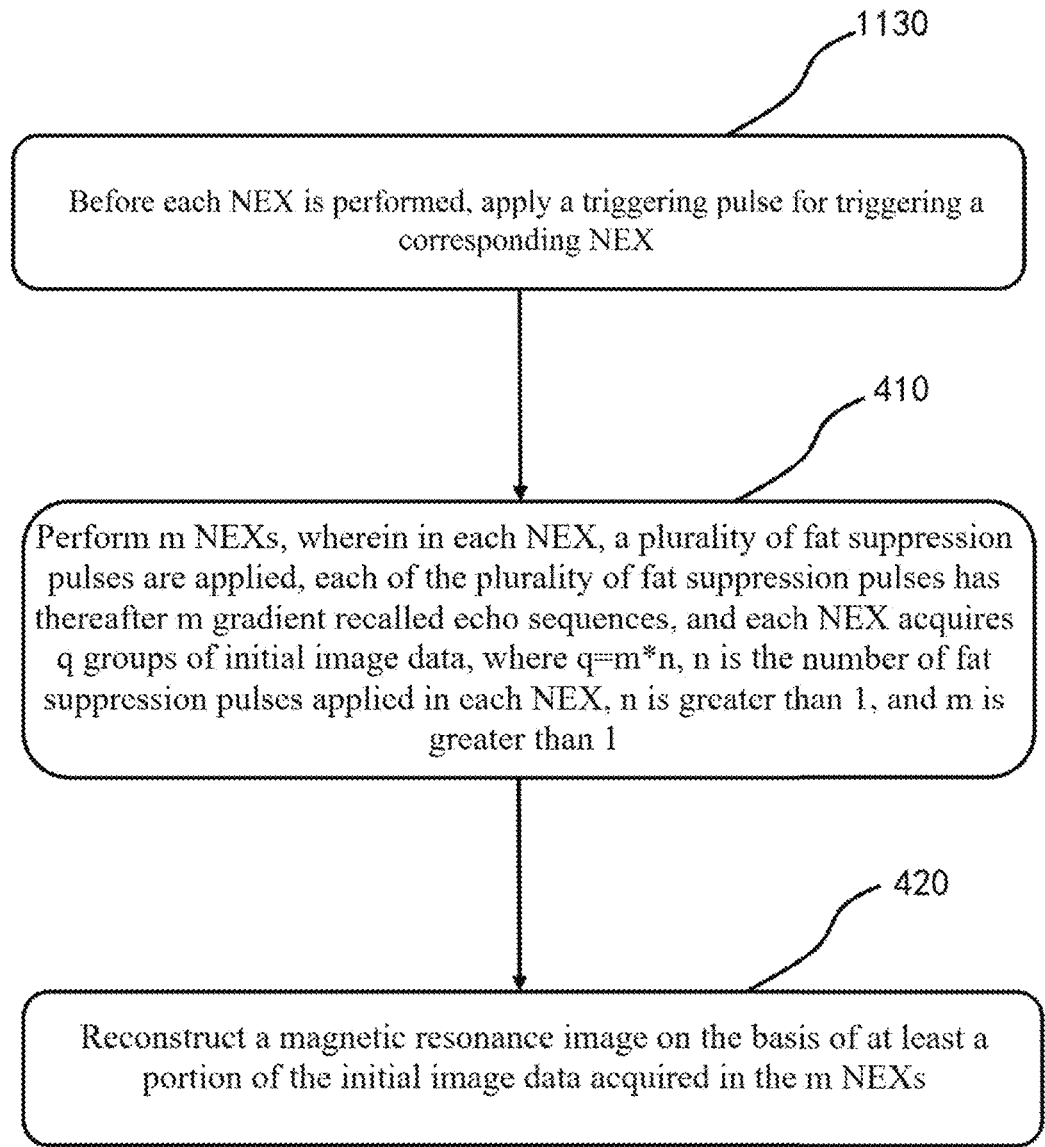
FIG. 11 shows a flowchart of a magnetic resonance imaging method according to another embodiment of the present invention.

FIG. 11 shows a flowchart of a magnetic resonance imaging method according to another embodiment of the present invention. In step 1130, before each NEX is performed, a triggering pulse is applied for triggering a corresponding NEX. An example of the triggering pulse may be the pulse RT shown in FIG. 5, which may trigger a corresponding NEX on the basis of a respiratory signal of the scan subject. The respiratory signal may be acquired on the basis of any existing method, and the NEX is triggered at a specific time point in a respiratory cycle (for example, at 30% of the respiratory cycle). Moreover, since the time of each NEX is short enough (for example, the imaging sequence can be completed within one respiratory cycle), there is no need to set respiratory gating, that is, there is no need to set the time window for executing the imaging sequence, simplifying the triggering mechanism.

Figure 12:
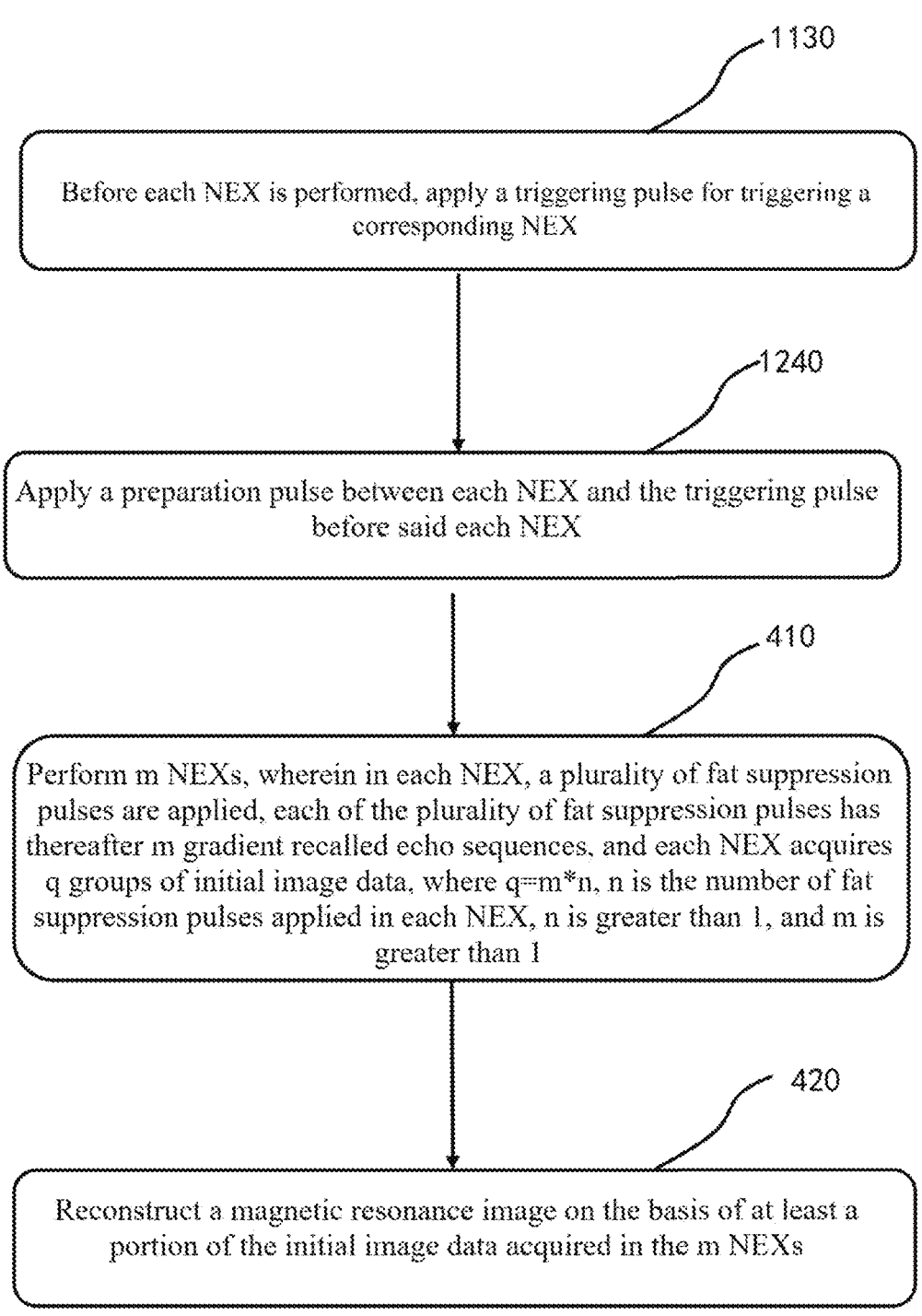
FIG. 12 shows a flowchart of a magnetic resonance imaging method according to another embodiment of the present invention.

FIG. 12 shows a flowchart of a magnetic resonance imaging method according to another embodiment of the present invention. In step 1240, a preparation pulse is further applied between each NEX and the triggering pulse before said each NEX. One example of the preparation pulse is the pulse IR shown in FIG. 5, which may be a 180-degree inversion recovery pulse, for example. It may be used to suppress adipose tissue before performing the NEX to improve the fat suppression effect.

In the embodiments of the present invention, the fat suppression pulse FS includes a frequency saturation pulse. It is understood by those skilled in the art that since proton resonance frequencies in adipose tissue and water tissue have a deviation (for example, the deviation is A Hertz (Hz)). If the proton resonance frequency of the water tissue is set to 0, in a conventional fat suppression pulse or oil pressure pulse, the proton resonance frequency of the adipose tissue is set to $-A$ Hz. When frequency suppression is performed, a frequency saturation pulse having a center frequency of $-A$ Hz is applied. Since adipose tissue can be effectively suppressed in a relatively small frequency domain, the pulse width is greater. In the embodiments of the present invention, the time for applying the fat suppression pulse is reduced by reducing the pulse width of the fat suppression pulse. At the same time, to avoid the increased suppression frequency domain causing water tissue to be suppressed, a larger frequency offset is set, so that the center frequency of the frequency saturation pulse has a frequency offset (for example, less than $-A$ Hz) with respect to the proton resonance frequency of the adipose tissue. In an embodiment, the selection range of the center frequency of the offset frequency saturation pulse may be $-450$ Hz to $-220$ Hz, and the selection range of the pulse width of the frequency saturation pulse used in the present invention may be 3.2 milliseconds to 8 milliseconds, which is smaller than a preset pulse width, wherein the preset pulse width refers to the pulse width of the frequency saturation pulse when the proton resonance frequency of the adipose tissue is the center frequency of the fat suppression pulse. More specifically, the selection range of the center frequency of the frequency saturation pulse may be $-400$ Hz to $-230$ Hz, and the selection range of the pulse width of the frequency saturation pulse may be 3.5 milliseconds to 7 milliseconds.

FIG. 13 shows a flowchart of a magnetic resonance imaging method according to another embodiment of the present invention. In step 1310, at least one NEX is performed, wherein in each of the at least one NEX, a plurality of fat suppression pulses are applied, each of the plurality of fat suppression pulses has thereafter m gradient recalled echo sequences, and each gradient recalled echo sequence is used to generate a group of initial image data, where m is greater than 1. The fat suppression pulses include a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency. In step 1320, the magnetic resonance image is reconstructed on the basis of at least a portion of the initial image data generated during the at least one NEX.

Figure 14:
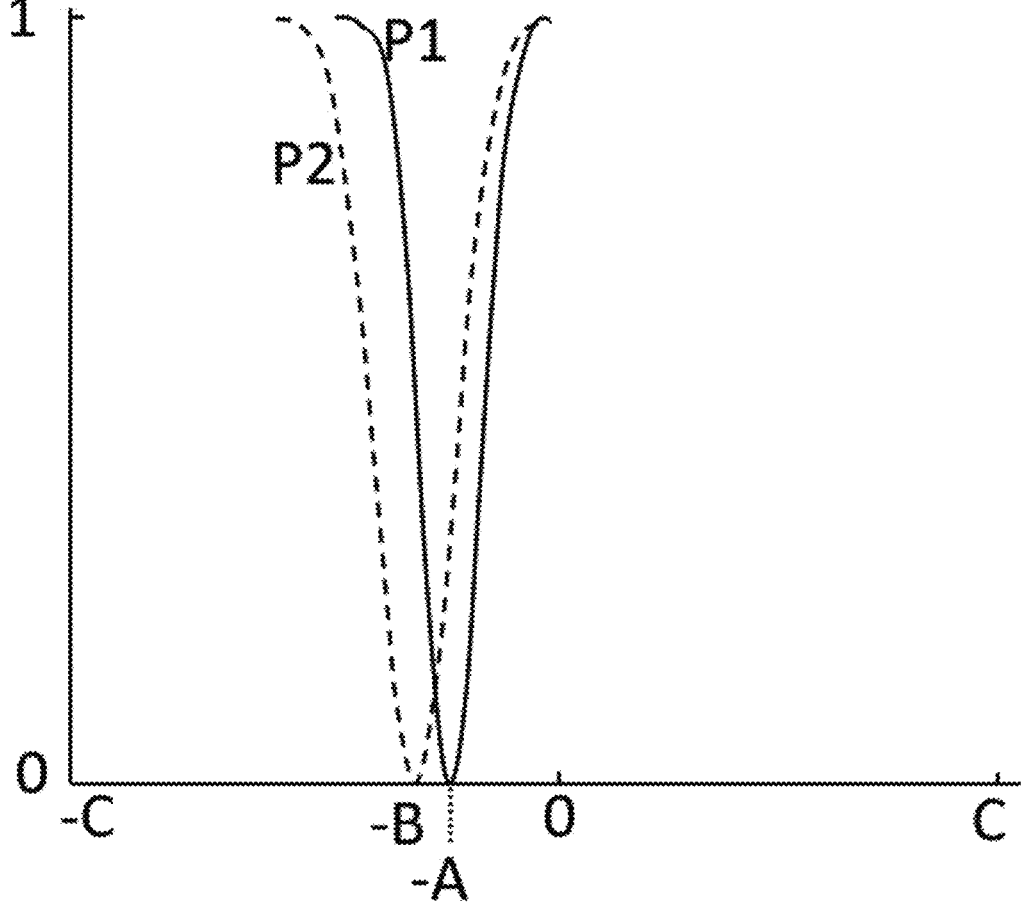
FIG. 14 shows a frequency domain representation curve of a frequency saturation pulse according to an embodiment of the present invention.

FIG. 14 shows a frequency domain representation curve of a frequency saturation pulse according to an embodiment of the present invention, wherein the horizontal axis represents a frequency offset, which has a value range of $-C$ to $C$, where $C$ is a constant, and the unit may be Hz. The longitudinal axis represents a longitudinal magnetization vector (Mz), which has a value range of 0 to 1. The proton resonance frequency in water tissue may be set to 0. The proton resonance frequency of adipose tissue has a frequency offset with respect to the proton resonance frequency of water tissue. The frequency offset is, for example, $-A$. A conventional frequency saturation pulse is as shown by curve P1, and has a center frequency of $-A$. The frequency saturation pulse used in the present invention may be shown as curve P2, and has a center frequency of $-B$, and a frequency offset with respect to the proton resonance frequency $-A$ of adipose tissue, where both A and B are constants, and B is greater than A. Moreover, the pulse width of the frequency saturation pulse P2 used in the present invention is greater, and greater than that of the frequency saturation pulse P1, that is, it is greater than the pulse width when the resonance frequency −A of the adipose tissue is the center frequency.

In the embodiment, while the fat suppression pulses are used, a plurality of gradient recalled echo sequences for fast imaging are applied after each fat suppression pulse, so that there is no need to provide a corresponding fat suppression pulse for each fast imaging sequence, and the overall scan time is shorter. By using the fat suppression pulses, the fat signal is effectively suppressed during imaging, avoiding inappropriate contrast between fat and other tissues, while avoiding the introduction of more pronounced respiratory motion artifacts into the image. Furthermore, by setting the center frequency offset and pulse width of the fat suppression pulse, the execution time of each fat suppression pulse is further shortened, thereby reducing the total scan time, so that the respiratory motion artifacts can be improved to a greater extent.

In the present embodiment, there may be a plurality of NEXs, for example m. By means of the plurality of NEXs, a better SNR can be achieved, and the aliasing artifacts can be reduced. However, in some applications, one NEX may be used to compromise the total scan time and the image quality.

When the plurality of NEXs are used, the magnetic resonance image is reconstructed on the basis of a plurality of groups of summed image data, wherein each group of summed image data includes the sum of m groups of initial image data, the m groups of initial image data of each group of summed image data have different phases, and the m groups of initial image data of each group of summed image data are generated in the m NEXs, respectively. The specific summation method may be similar to those described previously with reference to FIGS. 7 and 8, and will not be repeated here.

Similarly, in the present embodiment, a triggering pulse may be applied before each NEX, and a preparation pulse is applied between the triggering pulse and the NEX.

Figure 16:
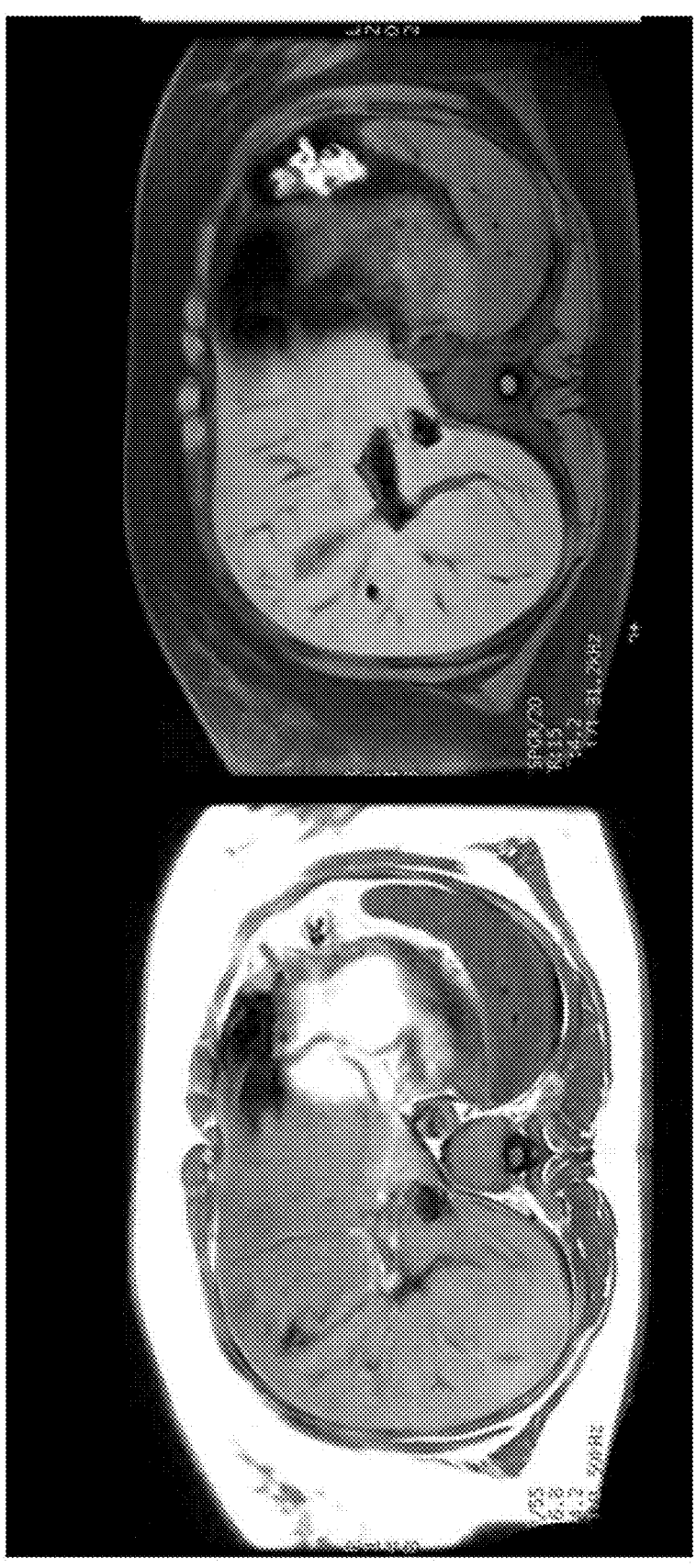
FIG. 16 is comparison of an image obtained by a method according to an exemplary embodiment of the present invention and an image obtained by a conventional method.

FIG. 16 is a comparison of an image obtained by a method according to an exemplary embodiment of the present invention and an image obtained by a conventional method, wherein the image on the right is the image obtained according to the embodiment of the present invention, and the image on the left is the image obtained by the conventional method. It is found by comparison that the image obtained according to the embodiment of the present invention has more appropriate image contrast, reduced respiratory motion artifacts, and improved SNR and image sharpness.

Embodiments of the present invention may further provide a computer-readable storage medium including a stored computer program, wherein the magnetic resonance imaging method in any of the above embodiments is executed when the computer program is run.

Figure 15:
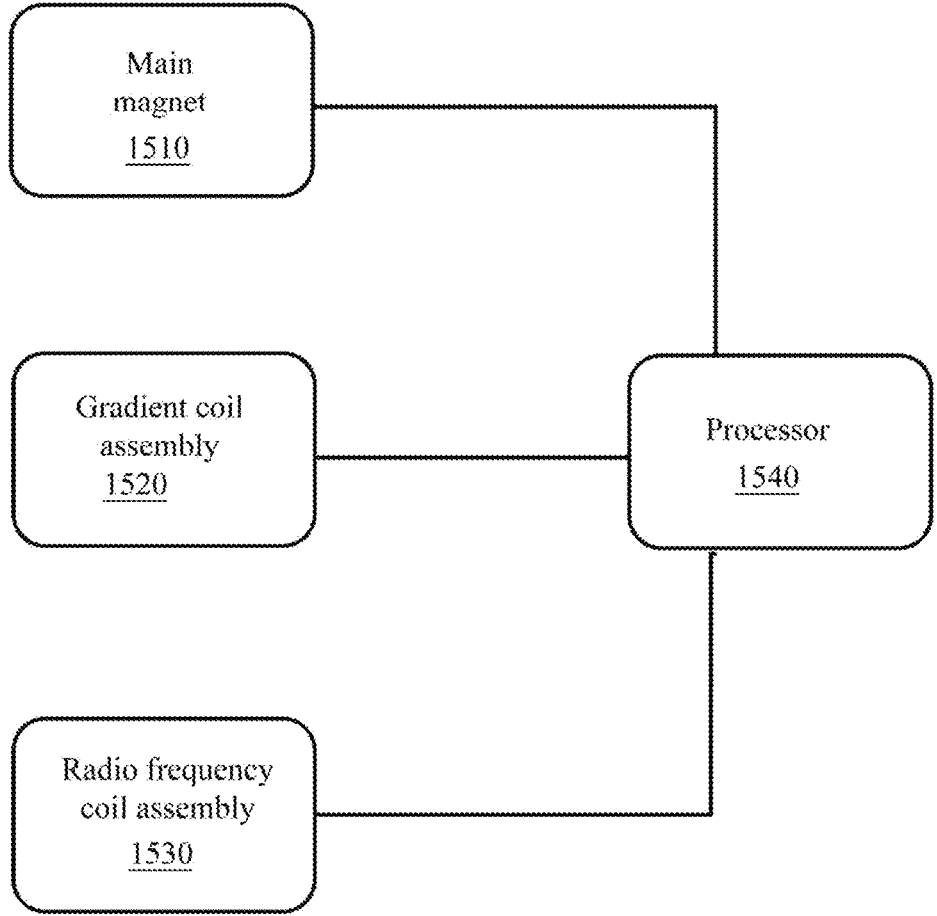
FIG. 15 shows a block diagram of a magnetic resonance imaging system according to another embodiment of the present invention.

Referring to FIG. 15, on the basis of the above description, an exemplary embodiment of the present invention may further provide a magnetic resonance imaging (MRI) system. The system includes a main magnet 1510, a gradient coil assembly 1520, a radio frequency coil assembly 1530, and a processor 1540. The structures and operating principles of respective components of the system may be similar to those of corresponding components shown in FIG. 1. The main magnet 1510 is used to surround at least a portion of a scan subject and produce a static magnetic field. The gradient coil assembly 1520 is used to apply at least one gradient magnetic field to the static magnetic field. The radio frequency coil assembly 1430 is used to apply a radio frequency field to the scan subject and receive a magnetic resonance signal from the scan subject. The processor is used to execute stored computer instructions, the computer instructions being used to implement the magnetic resonance imaging method according to any one of the embodiments of the present invention.

A magnetic resonance imaging method according to an embodiment of the present invention includes: performing m NEXs, wherein in each NEX, a plurality of fat suppression pulses are applied, each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1; and reconstructing a magnetic resonance image on the basis of at least a portion of the initial image data acquired in the m NEXs.

Furthermore, reconstructing a magnetic resonance image on the basis of at least a portion of the initial image data acquired in the m NEXs includes: performing summation processing on the initial image data acquired in the m NEXs to acquire q−m+1 groups of summed image data, wherein an sth group of initial image data in each subsequently performed NEX is summed with an (s+1)th group of initial image data in a previous NEX until the (s+1)th group of initial image data is the last group of initial image data in the NEX in which said (s+1)th group of initial image data is located, where s is greater than or equal to 1 and less than q; and reconstructing a magnetic resonance image on the basis of the q−m+1 groups of summed image data, wherein each group of data in the q−m+1 groups of summed image data includes a summation result of m groups of initial image data respectively acquired in the m NEXs.

Furthermore, m groups of image data in each group of summed image data have different phases.

Furthermore, the fat suppression pulses include a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency.

Furthermore, the selection range of the center frequency of the frequency saturation pulse is −450 Hz to −220 Hz, and the selection range of the pulse width of the frequency saturation pulse is 3.2 milliseconds to 8 milliseconds.

Furthermore, before performing each NEX, the method further includes: applying a triggering pulse, the triggering pulse being used to trigger a corresponding NEX.

Furthermore, the triggering pulse triggers a corresponding NEX on the basis of a respiratory signal of a scan subject.

Furthermore, a preparation pulse is further applied between each NEX and the triggering pulse before said each NEX.

A magnetic resonance imaging method according to another embodiment of the present invention includes:

performing m NEXs, wherein in each NEX, a plurality of fat suppression pulses are applied, each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1; and reconstructing a magnetic resonance image on the basis of a plurality of groups of summed image data, wherein each group of summed image data includes the sum of m groups of initial image data, the m groups of initial image data of each group of summed image data have different phases, and the m groups of initial image data of each group of summed image data are generated in the m NEXs, respectively.

Furthermore, the fat suppression pulses include a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency.

A magnetic resonance imaging method according to another embodiment of the present invention includes: performing at least one NEX, wherein in each of the at least one NEX, a plurality of fat suppression pulses are applied, each of the plurality of fat suppression pulses has thereafter m gradient recalled echo sequences, each gradient recalled echo sequence is used to generate a group of initial image data, m is greater than 1, the fat suppression pulses include a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency; and reconstructing a magnetic resonance image on the basis of at least a portion of the initial image data generated during the at least one NEX.

Furthermore, the number of NEXs is m, and reconstructing a magnetic resonance image on the basis of the at least a portion of the initial image data generated during the at least one NEX includes: reconstructing a magnetic resonance image on the basis of a plurality of groups of summed image data, wherein each group of summed image data includes the sum of m groups of initial image data, the m groups of initial image data of each group of summed image data have different phases, and the m groups of initial image data of each group of summed image data are generated in the m NEXs, respectively.

Furthermore, each NEX acquires q groups of initial image data, where q=m*n, n is the number of fat suppression pulses applied in each NEX, and n is greater than 1; and reconstructing a magnetic resonance image on the basis of the at least a portion of the initial image data generated during the at least one NEX includes: reconstructing the magnetic resonance image on the basis of q−m+1 groups of summed image data, wherein each group of data in the q−m+1 groups of summed image data includes a summation result of m groups of initial image data respectively acquired in the m NEXs, and wherein an sth group of initial image data in each subsequently performed NEX is summed with an (s+1)th group of initial image data in a previously performed NEX, where s is greater than or equal to 1 and less than q.

In addition to any previously indicated modifications, many other variations and replacement arrangements may be devised by those skilled in the art without departing from the substance and scope of the present description, and the appended claims are intended to encompass such modifications and arrangements. Therefore, although the information has been described above in specifics and detailed terms in connection with what is currently considered to be the most practical and preferred aspects, it will be apparent to those of ordinary skill in the art that many modifications can be made, including but not limited to the form, function, mode of operation, and use, without departing from the principles and concepts set forth herein. Likewise, as used herein, in all respects, the examples and embodiments are intended to be illustrative only and should not be construed as limiting in any way.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A magnetic resonance imaging method, the method comprising:

performing m NEXs, wherein in each NEX, a plurality of fat suppression pulses are applied, each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1; and reconstructing a magnetic resonance image on the basis of at least a portion of the initial image data acquired in the m NEXs.

2. A magnetic resonance imaging method, comprising:

performing m NEXs, wherein in each NEX, a plurality of fat suppression pulses are applied, each of the plurality of fat suppression pulses has thereafter m gradient recalled echo sequences, and each NEX acquires q groups of initial image data, where q=m*n, n is the number of fat suppression pulses applied in each NEX, n is greater than 1, and m is greater than 1; and reconstructing a magnetic resonance image on the basis of a plurality of groups of summed image data, wherein, each group of summed image data comprises the sum of m groups of initial image data, the m groups of initial image data of each group of summed image data have different phases, and the m groups of initial image data of each group of summed image data are generated in the m NEXs, respectively.

3. A magnetic resonance imaging method, comprising:

performing a plurality of NEXs, wherein in each of the plurality of NEXs, a plurality of fat suppression pulses are applied, each of the plurality of fat suppression pulses has thereafter m gradient recalled echo sequences, each gradient recalled echo sequence is used to generate a group of initial image data, where m is greater than 1, the fat suppression pulses comprise a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency; and reconstructing a magnetic resonance image on the basis of at least a portion of the initial image data generated during the plurality of NEXs.

4. The method according to claim 1, wherein reconstructing a magnetic resonance image on the basis of at least a portion of the initial image data acquired in the m NEXs comprises:

performing summation processing on the initial image data acquired in the m NEXs to acquire q−m+1 groups of summed image data, wherein, an sth group of initial image data in each subsequently performed NEX is summed with an (s+1)th group of initial image data in a previous NEX until the (s+1)th group of initial image data is the last group of initial image data in the NEX in which said (s+1)th group of initial image data is located, where s is greater than or equal to 1 and less than q; and reconstructing a magnetic resonance image on the basis of the q−m+1 groups of summed image data, wherein each group of data in the q−m+1 groups of summed image data comprises a summation result of m groups of initial image data respectively acquired in the m NEXs.

5. The method according to claim 1, wherein m groups of image data in each group of summed image data have different phases.

6. The method according to claim 1, wherein the fat suppression pulses comprise a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency.

7. The method according to claim 1, wherein before performing each NEX, the method further comprises:

applying a triggering pulse, the triggering pulse being used to trigger a corresponding NEX.

8. The method according to claim 1, wherein a preparation pulse is further applied between each NEX and a triggering pulse before said each NEX.

9. The method according to claim 2, wherein the fat suppression pulses comprise a frequency saturation pulse, the center frequency of the frequency saturation pulse has a frequency offset with respect to a proton resonance frequency of adipose tissue, the pulse width of the frequency saturation pulse is smaller than a preset pulse width, and the preset pulse width refers to the pulse width of the frequency saturation pulse when the proton resonance frequency of the adipose tissue is the center frequency.

10. The method according to claim 3, wherein the number of NEXs is m, and reconstructing a magnetic resonance image on the basis of at least a portion of the initial image data generated during the plurality of NEXs comprises:

reconstructing a magnetic resonance image on the basis of a plurality of groups of summed image data, wherein, each group of summed image data comprises the sum of m groups of the initial image data, the m groups of initial image data of each group of summed image data have different phases, and the m groups of initial image data of each group of summed image data are generated in the m NEXs, respectively.

11. The method according to claim 3, wherein before performing each NEX, the method further comprises:

applying a triggering pulse, the triggering pulse being used to trigger a corresponding NEX.

12. The method according to claim 11, wherein a preparation pulse is further applied between each NEX and the triggering pulse before said each NEX.

13. A magnetic resonance imaging system, comprising:

a main magnet used to surround at least a portion of a scan subject and produce a static magnetic field;

a gradient coil assembly used to apply at least one gradient magnetic field to the static magnetic field;

a radio frequency coil assembly used to apply a radio frequency field to the scan subject and receive a magnetic resonance signal from the scan subject; and a processor used to execute stored computer instructions, the computer instructions being used to implement the magnetic resonance imaging method according to claim 1.

14. The method according to claim 6, wherein the selection range of the center frequency of the frequency saturation pulse is −450 Hz to −220 Hz, and the selection range of the pulse width of the frequency saturation pulse is 3.2 milliseconds to 8 milliseconds.

15. The method according to claim 10, wherein each NEX acquires q groups of initial image data, where q=m*n, n is the number of fat suppression pulses applied in each NEX, and n is greater than 1; and reconstructing a magnetic resonance image on the basis of at least a portion of the initial image data generated during the plurality of NEXs comprises:

reconstructing the magnetic resonance image on the basis of q−m+1 groups of summed image data, wherein each group of data of the q−m+1 groups of summed image data comprises a summation result of m groups of initial image data respectively acquired in the m NEXs, and wherein an sth group of initial image data in each subsequently performed NEX is summed with an (s+1) th group of initial image data in a previously performed NEX, where s is greater than or equal to 1 and less than q.

16. The method according to claim 11, wherein the triggering pulse triggers a corresponding NEX on the basis of a respiratory signal of a scan subject.

17. The method according to claim 14, wherein the triggering pulse triggers a corresponding NEX on the basis of a respiratory signal of a scan subject.

* * * * *